(12) United States Patent
Kim

(10) Patent No.: US 9,910,072 B2
(45) Date of Patent: Mar. 6, 2018

(54) POWER-SUPPLY VOLTAGE SENSING DEVICE

(71) Applicant: SK hynix Inc., Icheon-si, Gyeonggi-do (KR)

(72) Inventor: Yeon Uk Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 112 days.

(21) Appl. No.: 14/959,025

(22) Filed: Dec. 4, 2015

(65) Prior Publication Data

US 2017/0067942 A1 Mar. 9, 2017

(30) Foreign Application Priority Data

Sep. 9, 2015 (KR) .......................... 10-2015-0127570

(51) Int. Cl.
*G01R 19/00* (2006.01)
*G01R 17/00* (2006.01)
*G01R 21/00* (2006.01)

(52) U.S. Cl.
CPC .............. *G01R 17/00* (2013.01); *G01R 21/00* (2013.01)

(58) Field of Classification Search
CPC .............. G01R 31/3606; G01R 31/362; G01R 31/3627; G01R 31/36; G01R 31/02; G01R 31/40; G01R 35/00
USPC ........ 324/76.11, 426, 437, 439, 450, 762.01, 324/764.01, 771
See application file for complete search history.

(56) References Cited

U.S. PATENT DOCUMENTS

| | | | |
|---|---|---|---|
| 6,441,584 B1 * | 8/2002 | Crass | H02J 7/0022 320/131 |
| 7,440,341 B2 | 10/2008 | Lee | |
| 7,821,234 B2 * | 10/2010 | Moriya | G01R 31/3624 320/134 |
| 8,659,962 B2 | 2/2014 | Lee | |
| 2008/0270079 A1 * | 10/2008 | Delory | G06F 11/273 702/186 |
| 2010/0033204 A1 * | 2/2010 | Santo | G01R 31/2879 324/750.05 |
| 2012/0126820 A1 * | 5/2012 | Tan | G01R 31/3631 324/434 |
| 2012/0224433 A1 * | 9/2012 | Mochida | G01R 31/2856 365/185.27 |

* cited by examiner

*Primary Examiner* — Giovanni Astacio-Oquendo
(74) *Attorney, Agent, or Firm* — William Park & Associates Ltd.

(57) ABSTRACT

A power-supply voltage sensing device is disclosed, which relates to a technology for detecting a level of an external power-supply voltage during a test mode. The power-supply voltage sensing device includes a reference voltage trimming unit configured to trim a reference voltage in response to a code signal, a power-supply voltage detection unit configured to select one of a power-supply voltage and an external power-supply voltage in response to a test signal, compare the external power-supply voltage with the reference voltage, and output a detection signal according to the result of comparison, and a reference voltage control unit configured to output the code signal in response to the detection signal.

20 Claims, 4 Drawing Sheets

POWER-SUPPLY VOLTAGE SENSING DEVICE

CROSS-REFERENCE TO RELATED APPLICATION

This application claims priority based upon Korean patent application No. 10-2015-0127570 filed on Sep. 9, 2015, the disclosure of which is incorporated herein by reference in its entirety.

BACKGROUND OF THE INVENTION

Embodiments of the present disclosure generally relate to a power-supply voltage sensing device, and more particularly to a technology for sensing a level of an external power-supply voltage during a test mode.

Voltage stability of a semiconductor integrated circuit (IC) is of importance to operational stability and reliability of the semiconductor IC.

A reference voltage generation circuit which generates a reference voltage with a predetermined voltage level may be helpful in maintaining internal voltages of the semiconductor IC at desired voltage levels even in a situation where an external power-supply voltage changes.

However, the reference voltage generated from the reference voltage generation circuit may vary depending not only on a change in the external power-supply voltage, but also on a deviation in a fabrication process and a temperature change of the semiconductor ICs.

In order to find various defects generated during the fabrication process of the semiconductor ICs, various tests are carried out on wafers and packages of the semiconductor ICs. Typically, in order to find the defects that may occur in an actual condition and environment, the above tests are performed under harsher conditions and environments than the actual conditions and environments.

Examples of the harsh test conditions may include various parameters such as temperature, voltage, test pattern, and test time. Here, an operation for increasing an internal power-supply voltage may be carried out by changing an operation voltage of an internal circuit.

With the development of new technologies, a reference voltage generation circuit of the semiconductor IC adjusts the external power-supply voltage, and an internal voltage driving unit of the semiconductor IC converts from the external power-supply voltage to the internal power-supply voltage of the internal circuit.

Most semiconductor devices including DRAM use not only an external voltage (e.g., VDD, VSS, etc.) received from an external device, but also an internal voltage, which is generated in the semiconductor devices and different in level from the external voltage.

Typically, the internal voltage is generated using the charge pumping scheme or the voltage down-converting scheme based on a reference voltage corresponding to a target level, an external power-supply voltage (e.g., VDD), and an external ground voltage (e.g., VSS).

Therefore, it is important for the semiconductor devices driven by various operation voltages to be tested by various external input voltages to detect a boundary point of a desired target voltage. This test may be performed by sweeping the various external voltages in various voltage levels.

However, the voltage sweep test takes a long time and is not cost-efficient.

BRIEF SUMMARY OF THE INVENTION

Various embodiments of the present disclosure are directed to providing a power-supply voltage sensing device that substantially obviates one or more problems due to limitations and disadvantages of the related art.

The embodiments of the present disclosure relate to a power-supply voltage sensing device which correctly senses a level of a target external power-supply voltage during a test mode, resulting in reduction of an overall test time.

In accordance with an embodiment of the present disclosure, a power-supply voltage sensing device includes: a reference voltage trimming unit configured to trim a reference voltage in response to a code signal; a power-supply voltage detection unit configured to select a power-supply voltage or an external power-supply voltage in response to a test signal, compare the external power-supply voltage with the reference voltage, and output a detection signal according to the result of comparison; and a reference voltage control unit configured to output the code signal in response to the detection signal.

It is to be understood that both the foregoing general description and the following detailed description of the present disclosure are exemplary and explanatory and are intended to provide further explanation of the invention as claimed.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Reference will now be made in detail to embodiments of the present disclosure, examples of which are illustrated in the accompanying drawings. Wherever possible, the same reference numbers are used throughout the drawings to refer to the same or like portions. In the following description of the present disclosure, a detailed description of related known configurations or functions incorporated herein may be omitted for clarity of the subject matter of the present disclosure.

Figure 1:
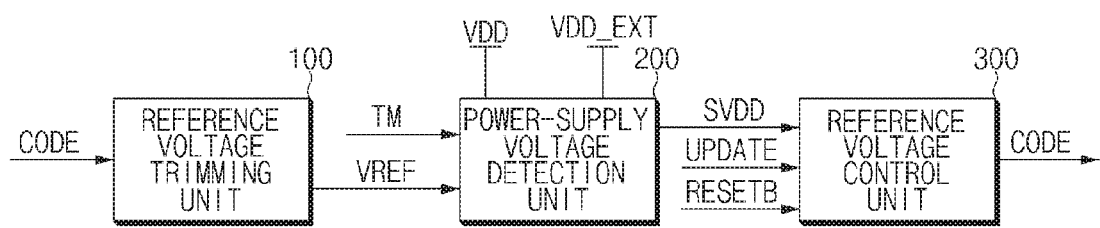
FIG. 1 is a block diagram illustrating a power-supply voltage sensing device according to an embodiment of the present disclosure.

FIG. 1 is a block diagram illustrating a power-supply voltage sensing device according to an embodiment of the present disclosure.

Referring to FIG. 1, the power-supply voltage sensing device includes a reference voltage trimming unit 100, a power-supply voltage detection unit 200, and a reference voltage control unit 300.

The reference voltage trimming unit 100 may trim a reference voltage VREF in response to a code signal CODE, and output the resultant voltage to the power-supply voltage detection unit 200.

The power-supply voltage detection unit 200 may select one of an external power-supply voltage VDD_EXT and a power-supply voltage VDD in response to a test signal TM. The power-supply voltage detection unit 200 may compare the selected voltage (i.e., the external power-supply voltage VDD_EXT or the power-supply voltage VDD) with the reference voltage VREF, and output a detection signal SVDD to the reference voltage control unit 300.

If a voltage that is divided from the external power-supply voltage VDD_EXT is identical to the level of the reference voltage VREF, the power-supply voltage detection unit 200 may change the logic level of the detection signal SVDD and output the changed detection signal SVDD.

The reference voltage control unit 300 may output the code signal CODE for controlling the reference voltage VREF in response to the detection signal SVDD, an update signal UPDATE, and a reset signal RESETB to the reference voltage trimming unit 100.

That is, the reference voltage control unit 300 may sequentially increase the code signal CODE when the update signal is activated and the detection signal SVDD is deactivated. In contrast, the reference voltage control unit 300 may maintain the voltage level of the code signal CODE when the detection signal SVDD is activated, and output the fixed code signal CODE.

Figure 2:
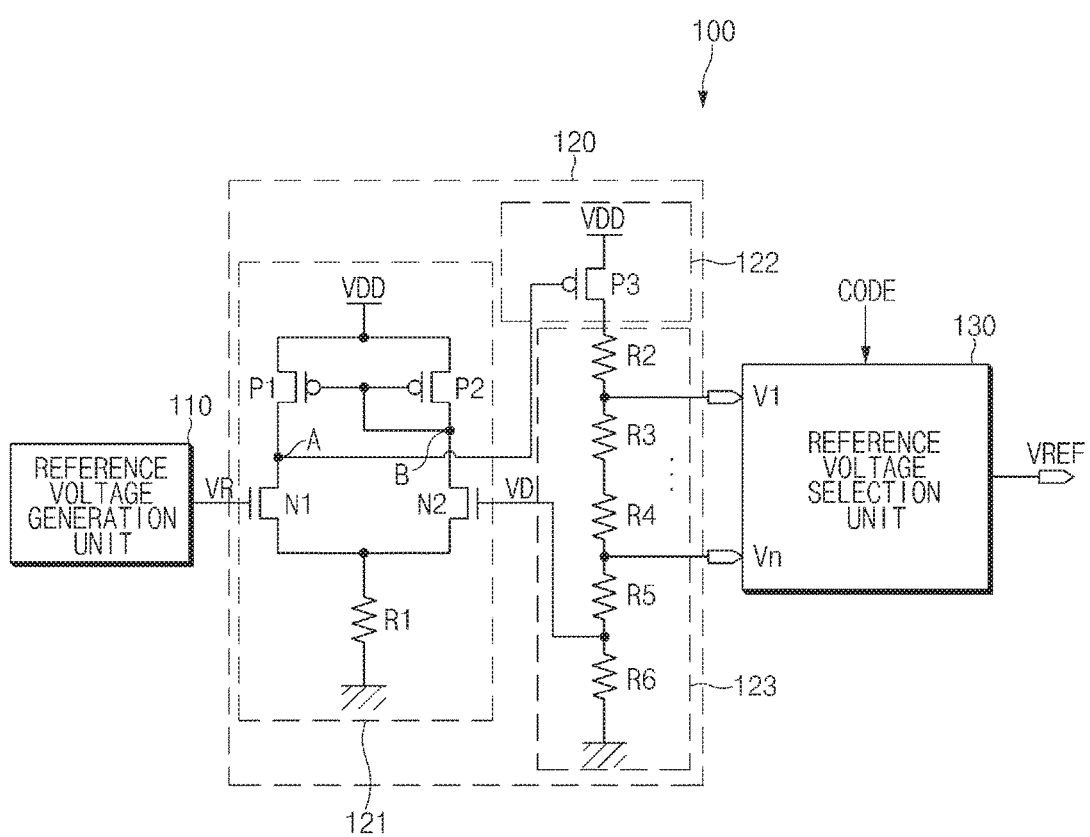
FIG. 2 is a detailed circuit diagram illustrating a reference voltage trimming unit shown in FIG. 1.

FIG. 2 is a detailed circuit diagram illustrating the reference voltage trimming unit 100 shown in FIG. 1.

The reference voltage trimming unit 100 may include a reference voltage generation unit 110, a voltage generation unit 120, and a reference voltage selection unit 130.

Here, the reference voltage generation unit 110 may generate a reference voltage VR and output the reference voltage VR to the voltage generation unit 120. Examples of the reference voltage generation unit 110 may include a Widlar reference voltage generator, a band-gap reference voltage generator, or the like, but it should be noted that the scope or categories of the reference voltage generation unit 110 applicable to various embodiments of the present disclosure is not limited thereto.

The voltage generation unit 120 may generate a plurality of voltages V1 to Vn having different voltage levels in response to the reference voltage VR. The voltage generation unit 120 may include a comparison unit 121, a driving unit 122, and a voltage division unit 123.

The comparison unit 121 may compare the reference voltage VR with a divided voltage VD, and output a comparison result to the driving unit 122. The comparison unit 121 may include PMOS transistors P1 and P2, NMOS transistors N1 and N2, and a resistor R1.

Source terminals of the PMOS transistors P1 and P2 may be coupled in common to an input terminal of the power-supply voltage VDD, and gate terminals thereof may be coupled in common to a node B. The NMOS transistor N1 may be coupled between a node A and the resistor R1 and receive the reference voltage VR through a gate terminal thereof. In addition, the NMOS transistor N2 may be coupled between the node B and the resistor R1 and receive the divided voltage VD through a gate terminal thereof. The resistor R1 may be coupled between a common source terminal of the NMOS transistors N1 and N2 and a ground voltage terminal.

In the comparison unit 121, current-driving capabilities of the NMOS transistors N1 and N2 changes in response to the divided voltage VD and the reference voltage VR, and as a result, voltages of both the nodes A and B of the comparison unit 121 change.

For example, if the divided voltage VD is higher than the reference voltage VR in the comparison unit 121, the NMOS transistor N1 may be turned on. Therefore, a low-level signal may be output through the node A so that the driving unit 122 can be turned on.

In contrast, if the divided voltage VD is lower than the reference voltage VR in the comparison unit 121, the NMOS transistor N2 and the PMOS transistors P1 and P2 may be turned on. Accordingly, a high-level signal may be output through the output node A so that the driving unit 122 can be turned off.

The driving unit 122 may selectively provide the power-supply voltage VDD in response to the output signal of the comparison unit 121.

The driving unit 122 may include a pull-up drive element (e.g., PMOS transistor P3) coupled between the input terminal of the power-supply voltage VDD and the voltage division unit 123, and a gate terminal of the pull-up drive element (e.g., PMOS transistor P3) is coupled to the node A.

The PMOS transistor P3 is turned on when the output signal of the node A is at a logic low level and applies the power-supply voltage VDD to the voltage division unit 12. In contrast, the PMOS transistor P3 is turned off when the output signal of the node A is at a logic high level and does not apply the power-supply voltage VDD to the voltage division unit 123.

In addition, the voltage division unit 123 may divide the power-supply voltage VDD received from the driving unit 122 into a plurality of voltages V1 to Vn having different voltage levels, and output the plurality of voltages V1 to Vn to the reference voltage selection unit 130. The voltage division unit 123 may include a plurality of resistors R2 to R6 coupled in series between the driving unit 122 and the ground voltage terminal.

The resistors R2 to R6 may generate a plurality of voltages V1 to Vn having different values obtained by a voltage division. The divided voltage VD may be output through a connection node of the resistors R5 and R6 coupled to the last stage.

In addition, the reference voltage selection unit 130 may select one of the voltages V1 to Vn having different voltage levels upon in response to the code signal CODE provided by the reference voltage control unit 300, and output the selected voltage as the reference voltage VREF.

The reference voltage selection unit 130 may sequentially select one of the plurality of voltages V1 to Vn in ascending order of voltage levels in response to the code signal CODE. In addition, the reference voltage selection unit 130 may also sequentially select the plurality of voltages in descending order of voltage levels in response to the code signal CODE.

Figure 3:
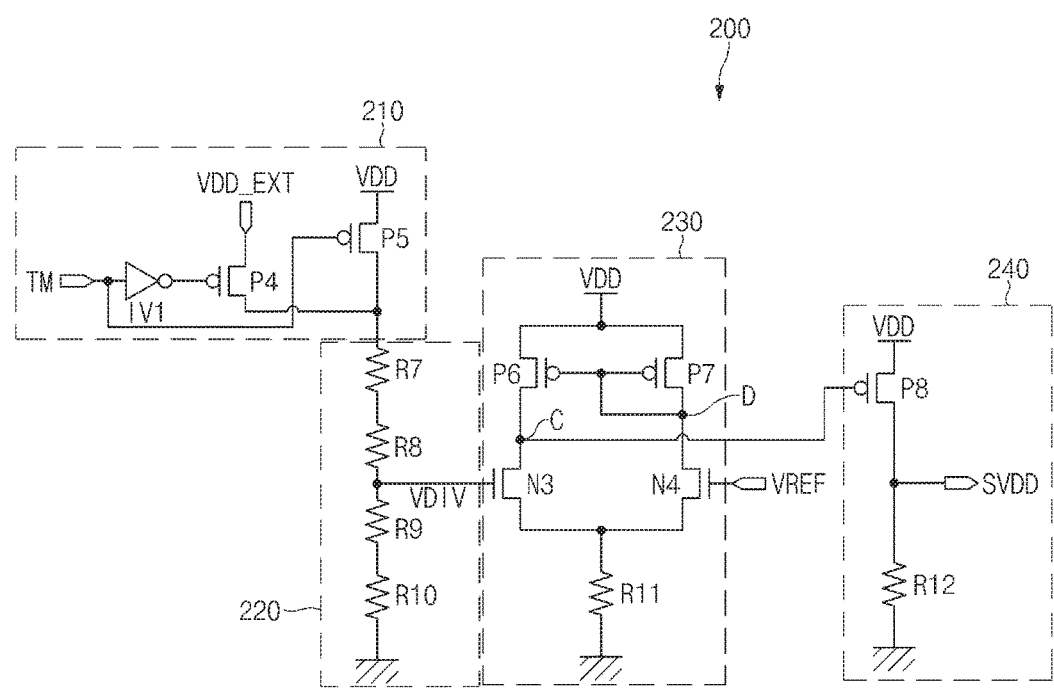
FIG. 3 is a detailed circuit diagram illustrating a power-supply voltage detection unit shown in FIG. 1.

FIG. 3 is a detailed circuit diagram illustrating the power-supply voltage detection unit 200 shown in FIG. 1.

Referring to FIG. 3, the power-supply voltage detection unit 200 may include a power-supply voltage selection unit 210, a voltage division unit 220, a comparison unit 230, and an output driving unit 240.

The power-supply voltage selection unit 210 may select one of the external power-supply voltage VDD_EXT and the power-supply voltage VDD in response to the test signal TM. Here, the external power-supply voltage VDD_EXT may be a power-supply voltage received from an external test pad during a test mode. That is, the external power-supply voltage VDD_EXT may be received from an automated test equipment (not shown).

For example, if the test signal TM is at a logic high level during the test mode, the external power-supply voltage VDD_EXT is selected and output to the voltage division unit 220. In contrast, if the test signal TM is at a logic low level during a normal mode, the power-supply voltage VDD is selected and output to the voltage division unit 220.

That is, during the normal mode, the power-supply voltage VDD is selected, and the detection signal SVDD is then output. During the test mode, the external power-supply voltage VDD_EXT is selected, and the detection signal SVDD is then output. The external power-supply voltage VDD_EXT may be set to a user-desired voltage level.

The power-supply voltage selection unit 210 may include an inverter IV1 and PMOS transistors P4 and P5. Here, the PMOS transistor P4 and the PMOS transistor P5 may be complementary to each other in their operations.

The PMOS transistor P4 is coupled between an input terminal of the external power-supply voltage VDD_EXT and the voltage division unit 220 and receives the test signal TM inverted by the inverter IV1 through a gate terminal thereof. The PMOS transistor P5 is coupled between the input terminal of the power-supply voltage VDD and the voltage division unit 220 and receives the test signal TM through a gate terminal thereof.

The voltage division unit 220 may distributing either the external power-supply voltage VDD_EXT or the power-supply voltage VDD received from the power-supply voltage selection unit 210 among resistors of the voltage division unit 220, and output a divided voltage VDIV to the comparison unit 230. In an embodiment, the voltage division unit 220 may include a plurality of resistors R7 to R10 coupled in series between the power-supply voltage selection unit 210 and the ground voltage terminal with the external power-supply voltage VDD_EXT or the power-supply voltage VDD applied across the plurality of resistors R7 to R10. In an embodiment, the voltage division unit 220 may output the divided voltage VDIV through an output node coupled between the resistors R8 and R9.

The comparison unit 230 may compare the reference voltage VREF with the divided voltage VDIV, and output the comparison result to the output driving unit 240. The comparison unit 230 may include PMOS transistors P6 and P7, NMOS transistors N3 and N4, and a resistor R11.

Source terminals of the PMOS transistors P6 and P7 may be coupled in common to the input terminal of the power-supply voltage VDD, and gate terminals thereof may be coupled in common to a node D. The NMOS transistor N3 may be coupled between a node C and the resistor R11 and receive the divided voltage VDIV through a gate terminal thereof. In addition, the NMOS transistor N4 may be coupled between the node D and the resistor R11 and receive the reference voltage VREF through a gate terminal thereof. The resistor R11 may be coupled between a common source terminal of the NMOS transistors N3 and N4 and the ground voltage terminal.

In the comparison unit 230, the current-driving capabilities of the NMOS transistors N3 and N4 change in response to the divided voltage VDIV and the reference voltage VREF, and as a result voltages of both nodes C and D of the comparison unit 230 change.

For example, if the reference voltage VREF is higher than the divided voltage VDIV in the comparison unit 230, the NMOS transistor N4 and PMOS transistors P6 and P7 may be turned on. Therefore, a high-level signal may be output through the node C, and thus the PMOS transistor P8 of the output driving unit 240 can be turned off. As a result, the voltage level of the detection signal SVDD does not increase any more.

In contrast, if the reference voltage VREF is lower than the divided voltage VDIV in the comparison unit 230, the NMOS transistor N3 can be turned on. Accordingly, a high-level signal may be output through the output node C, and thus the PMOS transistor P8 of the driving unit 240 can be turned on. As a result, the voltage level of the detection signal SVDD increases.

As described above, the comparison unit 230 may change the logic level of the detection signal SVDD by using the reference voltage VREF received from the reference voltage trimming unit 100 as a reference. That is, if the divided voltage VDIV, which is obtained by a voltage division based on the external power-supply voltage VDD_EXT, is identical to the reference voltage VREF, the logic level of the detection signal SVDD changes from a logic low level to a logic high level.

The detection signal SVDD may be used to detect a specific point in time at which the divided voltage VDIV corresponding to the external power-supply voltage VDD_EXT is identical to the reference voltage VREF. Accordingly, the comparison unit 230 can detect the voltage level of the external power-supply voltage EXT_VDD in response to the logic level of the detection signal SVDD without sweeping the external power-supply voltage EXT_VDD during the test mode.

The output driving unit 240 may selectively provide the power-supply voltage VDD in response to the output signal of the comparison unit 230, and thus output the detection signal SVDD. If the output signal of the comparison unit 230 is at a logic low level, the output driving unit 240 may output the detection signal SVDD that is at a logic high level. If the output signal of the comparison unit 230 is at a logic high level, the output driving unit 240 may output the detection signal SVDD that is at a logic low level.

The output driving unit 240 may include a PMOS transistor P8 and a resistor R12 which are coupled in series between the input terminal of the power-supply voltage VDD and the ground voltage terminal. The PMOS transistor P8 is coupled between the input terminal of the power-supply voltage VDD and an output terminal of the detection signal SVDD, and a gate terminal thereof is coupled to the node C. The resistor R12 may be coupled between the output terminal of the detection signal SVDD and the ground voltage terminal.

Figure 4:
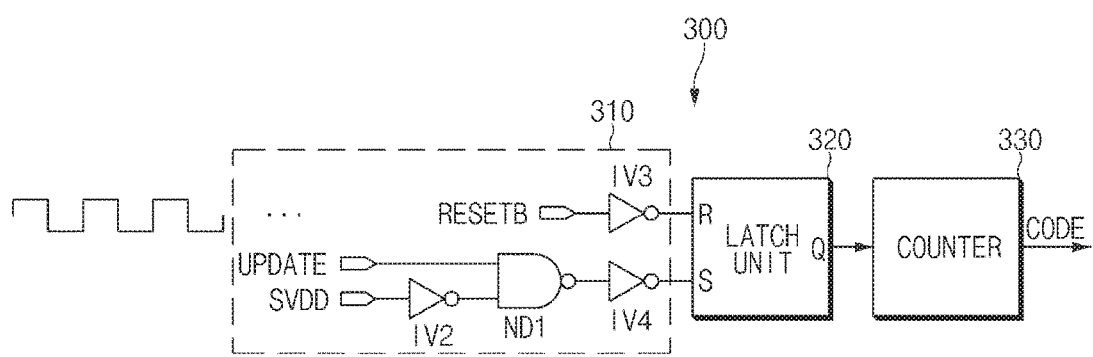
FIG. 4 is a detailed circuit diagram illustrating a reference voltage control unit shown in FIG. 1.

FIG. 4 is a detailed circuit diagram illustrating the reference voltage control unit 300 shown in FIG. 1.

Referring to FIG. 4, the reference voltage control unit 300 may include an input unit 310, a latch unit 320, and a counter 330.

The input unit 310 may receive the reset signal RESET, the detection signal SVDD, and the update signal UPDATE, and perform a logic operation on the signals RESET, SVDD, and UPDATE.

If the reset signal RESETB is activated (e.g., a logic low level), the input unit 310 may reset the latch unit 320. If the update signal UPDATE is at a logic high level, the input unit 320 may output a logic-high-level signal to the latch unit 320. Here, the update signal UPDATE may be a clock signal received from an oscillator (not shown). If the detection signal SVDD is at a logic high level, the input unit 320 may output a logic-low-level signal to the latch unit 320, irrespective of the update signal UPDATE.

The input unit 310 may include inverters IV2 to IV4 and a NAND gate ND1. The inverter IV3 may invert the reset signal RESETB and output the resultant signal to the latch unit 320. The NAND gate ND1 may perform a NAND operation on the update signal UPDATE and a signal obtained by inverting the detection signal SVDD at the inverter IV2. The inverter IV4 may invert the output signal of the NAND gate ND1, and output the inverted output signal to the latch unit 320.

In addition, the latch unit 320 may be reset when the reset signal RESETB is activated, and may store the output signal of the input unit 320 for a certain period of time and then output the stored signal to the counter 330.

In addition, the counter 330 may count based on the output signal of the latch unit 320, and output the code signal CODE to the reference voltage trimming unit 100. The counter 330 may perform the counting operation in response to the output signal of the latch unit 320, and output the code signal CODE.

Examples of the counter 330 may include a bit counter, and may increment or decrement the number in the counter 330 in response to the output signal of the latch unit 320. If the counter 330 is an up counter, the counter 330 may increment the number therein in response to the output signal of the latch unit 320 and output the code signal CODE. In contrast, if the counter 330 is a down counter, the counter 330 may decrement the number therein in response to the output signal of the latch unit 320 and output the code signal CODE.

As described above, if the logic level of the detection signal SVDD is a logic low level, and the update signal UPDATE is a clock signal, the counter 330 may continuously perform the counting operation. Accordingly, the code signal CODE increments or decrements, and thus one of the voltages V1 to Vn generated from the reference voltage selection unit 130 is selected.

However, if the logic level of the detection signal SVDD transitions to a logic high level, the counter 330 may stop the counting operation. Accordingly, the code signal CODE maintains its value and is output to the reference voltage selection unit 130. In this case, the reference voltage VREF is also fixed to the same voltage value as the external power-supply voltage VDD_EXT so that the level of the detection signal SVDD can be detected.

In other words, if the divided voltage VDIV corresponding to the external power-supply voltage VDD_EXT is identical to the reference voltage VREF in the power-supply voltage detection unit 200, the logic level of the detection signal SVDD changes from a logic low level to a logic high level. In this case, the counter 330 may stop the counting operation, and the code signal CODE may be fixed.

As described above, the power-supply voltage sensing device in accordance with embodiments of the present disclosure does not sweep the external voltage of the test device through a specific voltage range (e.g., the range of 0V to VDD). In addition, a specific voltage (e.g., a user-desired voltage of 1.5V) may be transferred from the test device to the semiconductor device to recognize the specific voltage through the external power-supply voltage VDD_EXT.

The power-supply voltage sensing device in accordance with embodiments may reduce the amount of time taken for an on/off operation needed for sweeping the external voltage of the test device and thus productivity of the semiconductor devices may be improved. In addition, a plurality of circuits in accordance with various embodiments may be designed by referring to unique characteristics of the external power-supply voltage VDD_EXT that changes at a specific boundary point (e.g., if the power-supply voltage changes in the range of 0V to 2V, the on/off operation is performed at 1.5V or higher), and thus improve quality of semiconductor products.

In order to reduce power consumption in highly-integrated semiconductor memory devices, various internal voltages having different levels are generated and used in the semiconductor memory device. For example, a low voltage may be used in a core region, whereas a high voltage may be used in an over-driving operation needed for high-speed data access.

However, all semiconductor chips manufactured through the same semiconductor fabrication process as one another generally do not have the same internal voltages (e.g., VREF, VCORE, VPP, VDLL, and VPERI) as one another. As a result, during the probe test prior to packaging processes of the semiconductor chips, fuse cutting is performed so that the internal voltage values can be properly adjusted and thus meet technical specifications.

In accordance with various embodiments of the present disclosure, a value of the fixed code signal CODE may be output externally through a DQ pad. In addition, the output value of the DQ pad may also be used as trimming data of the internal voltage by using a fuse or the like.

As is apparent from the above description, various embodiments of the present disclosure provide a power-supply voltage sensing device which correctly detects a level of a target external power-supply voltage during a test mode while minimizing overall test time and improving product quality.

Those skilled in the art will appreciate that the invention may be carried out in other specific ways than those set forth herein without departing from the spirit and essential characteristics of the invention. The above embodiments are therefore to be construed in all aspects as illustrative and not restrictive. The scope of the invention should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A power-supply voltage sensing device comprising:
    a reference voltage trimming circuit configured to trim a reference voltage in response to a code signal;
    a power-supply voltage detection circuit configured to select one of a power-supply voltage and an external power-supply voltage in response to a test signal, compare the external power-supply voltage with the reference voltage, and output a detection signal according to the result of comparison; and
    a reference voltage control circuit configured to output the code signal in response to the detection signal.

2. The power-supply voltage sensing device according to claim 1, wherein the reference voltage trimming circuit includes:
    a reference voltage generation circuit configured to generate a first reference voltage;

a voltage generation circuit configured to generate a plurality of voltages having different voltage levels in response to the first reference voltage; and a reference voltage selection circuit configured to select one of the plurality of voltages in response to the code signal, and output the selected voltage as the reference voltage.

3. The power-supply voltage sensing device according to claim 2, wherein the voltage generation circuit includes:

a first comparison circuit configured to compare the first reference voltage with a first division voltage;

a driving circuit configured to selectively provide the power-supply voltage in response to an output signal of the first comparison circuit; and a first voltage division circuit configured to output the first division voltage and the plurality of voltages obtained by a voltage division based on a supply voltage of the driving circuit.

4. The power-supply voltage sensing device according to claim 3, wherein the first comparison circuit controls the driving circuit in a way that drives the driving circuit when the first reference voltage is higher than the first division voltage but does not drive the driving circuit when the reference voltage is lower than the first division voltage.

5. The power-supply voltage sensing device according to claim 3, wherein the driving circuit includes:

a first pull-up drive element coupled between an input terminal of the power-supply voltage and the first voltage division circuit, the first pull-up drive element being controlled by an output signal of the first comparison circuit.

6. The power-supply voltage sensing device according to claim 3, wherein the first voltage division circuit includes a plurality of resistors coupled in series between the driving circuit and a ground voltage terminal, and outputs the plurality of voltages through respective connection nodes of the plurality of resistors.

7. The power-supply voltage sensing device according to claim 6, wherein the first voltage division circuit outputs the first division voltage through a connection node of two resistors coupled to a final stage, from among the plurality of resistors.

8. The power-supply voltage sensing device according to claim 2, wherein the reference voltage selection circuit sequentially selects one of the plurality of voltages in response to the code signal.

9. The power-supply voltage sensing device according to claim 1, wherein the power-supply voltage detection circuit changes a logic level of the detection signal when a voltage division value of the external power-supply voltage is identical in level to the reference voltage.

10. The power-supply voltage sensing device according to claim 1, wherein the power-supply voltage detection circuit includes:

a power-supply voltage selection circuit configured to select one of the external power-supply voltage and the power-supply voltage in response to the test signal;

a second voltage division circuit configured to divide a voltage received from the power-supply voltage selection circuit, and output a second division voltage;

a second comparison circuit configured to compare the reference voltage with the second division voltage; and an output driving circuit configured to output the detection signal by driving an output signal of the second comparison circuit.

11. The power-supply voltage sensing device according to claim 10, wherein the second voltage division circuit includes a plurality of resistors coupled in series between the power-supply voltage selection circuit and a ground voltage terminal.

12. The power-supply voltage sensing device according to claim 10, wherein the output driving circuit outputs the detection signal of a logic high level when the output signal of the second comparison circuit is at a logic low level, and outputs the detection signal of a logic low level when the output signal of the second comparison circuit is at a logic high level.

13. The power-supply voltage sensing device according to claim 10, wherein the output driving circuit includes:

a second pull-up drive element coupled between an input terminal of the power-supply voltage and the output terminal of the detection signal, the second pull-up drive being driven by the output signal of the second comparison circuit; and a resistor coupled between the second pull-up drive element and a ground voltage terminal.

14. The power-supply voltage sensing device according to claim 11, wherein the power-supply voltage detection circuit selects the external power-supply voltage when the test signal is activated, and selects the power-supply voltage when the test signal is deactivated.

15. The power-supply voltage sensing device according to claim 1, wherein the external power-supply voltage is a voltage received from an external test pad during a test mode.

16. The power-supply voltage sensing device according to claim 1, wherein the external power-supply voltage is set to a user-desired voltage level.

17. The power-supply voltage sensing device according to claim 1, wherein the reference voltage control circuit controls the code signal by combining the detection signal and an update signal.

18. The power-supply voltage sensing device according to claim 17, wherein the reference voltage control circuit sequentially changes the code signal when the update signal is activated and the detection signal is deactivated.

19. The power-supply voltage sensing device according to claim 17, wherein the reference voltage control circuit includes:

an input circuit configured to combine the detection signal, the update signal, and a rest signal;

a latch circuit configured to store an output signal of the input circuit; and a counter configured to output the code signal by counting based on an output signal of the latch circuit.

20. The power-supply voltage sensing device according to claim 1, wherein the reference voltage control circuit outputs a fixed code signal when the detection signal is activated.

* * * * *